United States Patent
Wang et al.

(10) Patent No.: US 12,308,346 B2
(45) Date of Patent: May 20, 2025

(54) SEMICONDUCTOR DIE WITH TAPERED SIDEWALL IN PACKAGE

(71) Applicant: Taiwan Semiconductor Manufacturing Company, Ltd., Hsinchu (TW)

(72) Inventors: Chin-Hua Wang, New Taipei (TW); Shin-Puu Jeng, Hsinchu (TW); Po-Yao Lin, Zhudong Township, Hsinchu County (TW); Po-Chen Lai, Hsinchu County (TW); Shu-Shen Yeh, Taoyuan (TW); Ming-Chih Yew, Hsinchu (TW); Yu-Sheng Lin, Zhubei (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 17/350,371

(22) Filed: Jun. 17, 2021

(65) Prior Publication Data

US 2022/0406752 A1 Dec. 22, 2022

(51) Int. Cl.
*H01L 25/065* (2023.01)
*H01L 21/304* (2006.01)
(Continued)

(52) U.S. Cl.
CPC ...... *H01L 25/0655* (2013.01); *H01L 21/3043* (2013.01); *H01L 23/3185* (2013.01);
(Continued)

(58) Field of Classification Search
None
See application file for complete search history.

(56) References Cited

U.S. PATENT DOCUMENTS

| | | | |
|---|---|---|---|
| 6,407,458 B1 * | 6/2002 | Huemoeller | H01L 23/49816 257/774 |
| 7,342,320 B2 * | 3/2008 | Hedler | H01L 23/481 257/737 |

(Continued)

FOREIGN PATENT DOCUMENTS

| | | | | |
|---|---|---|---|---|
| JP | 2010272562 A | * | 12/2010 | ....... H01L 23/49827 |
| JP | 2017505999 A | * | 2/2017 | |

(Continued)

OTHER PUBLICATIONS

Chinese language office action dated Apr. 21, 2023, issued in application No. TW 111111781.

*Primary Examiner* — Telly D Green
(74) *Attorney, Agent, or Firm* — McClure, Qualey & Rodack, LLP

(57) ABSTRACT

Structures and formation methods of a chip package structure are provided. The chip package structure includes adjacent first and second semiconductor dies bonded over an interposer substrate. The chip package structure also includes an insulating layer formed over the interposer substrate. The insulating layer has a first portion surrounding the first and second semiconductor dies and a second portion extending between a first sidewall of the first semiconductor die and a second sidewall of the second semiconductor die, and between the interposer substrate and the first and second semiconductor dies. The lateral distance from the top end of the first sidewall to the top end of the second sidewall is greater than the lateral distance from the bottom end of the first sidewall to the bottom end of the second sidewall.

20 Claims, 15 Drawing Sheets

(51) Int. Cl.
    *H01L 23/00*     (2006.01)
    *H01L 23/31*     (2006.01)
    *H01L 25/00*     (2006.01)
    *H01L 25/18*     (2023.01)

(52) U.S. Cl.
    CPC .......... *H01L 23/3192* (2013.01); *H01L 25/18* (2013.01); *H01L 25/50* (2013.01); *H01L 24/13* (2013.01); *H01L 24/16* (2013.01); *H01L 24/32* (2013.01); *H01L 24/73* (2013.01); *H01L 2224/13082* (2013.01); *H01L 2224/16225* (2013.01); *H01L 2224/32225* (2013.01); *H01L 2224/73204* (2013.01)

(56) References Cited

U.S. PATENT DOCUMENTS

| | | | |
|---|---|---|---|
| 8,350,364 B2 * | 1/2013 | Hedler | H01L 23/481 257/737 |
| 8,993,380 B2 | 3/2015 | Hou et al. | |
| 9,281,254 B2 | 3/2016 | Yu et al. | |
| 9,299,649 B2 | 3/2016 | Chiu et al. | |
| 9,372,206 B2 | 6/2016 | Wu et al. | |
| 9,418,877 B2 * | 8/2016 | Gu | H01L 23/49811 |
| 9,425,126 B2 | 8/2016 | Kuo et al. | |
| 9,443,783 B2 | 9/2016 | Lin et al. | |
| 9,461,018 B1 | 10/2016 | Tsai et al. | |
| 9,496,189 B2 | 11/2016 | Yu et al. | |
| 9,666,502 B2 | 5/2017 | Chen et al. | |
| 9,735,131 B2 | 8/2017 | Su et al. | |
| 9,929,071 B2 | 3/2018 | Cheng et al. | |
| 2002/0158345 A1 * | 10/2002 | Hedler | H01L 23/481 257/E25.011 |
| 2008/0006900 A1 * | 1/2008 | Chan | H01L 21/563 257/E23.125 |
| 2008/0054443 A1 * | 3/2008 | Shih | H01L 24/19 257/E23.178 |
| 2013/0187258 A1 * | 7/2013 | Lu | H01L 23/3135 257/621 |
| 2013/0200529 A1 * | 8/2013 | Lin | H01L 25/0655 257/E23.116 |
| 2014/0112629 A1 * | 4/2014 | Numata | G02B 6/4239 264/1.27 |
| 2015/0001701 A1 * | 1/2015 | Li | H05K 5/03 257/713 |
| 2015/0318262 A1 * | 11/2015 | Gu | H01L 23/145 257/737 |
| 2016/0225742 A1 * | 8/2016 | Davis | H01L 29/0657 |
| 2016/0233175 A1 * | 8/2016 | Dubey | H01L 29/06 |
| 2016/0351477 A1 * | 12/2016 | Marchisi | H01L 25/0655 |
| 2017/0213809 A1 * | 7/2017 | Lu | H01L 24/97 |
| 2018/0190560 A1 * | 7/2018 | Li | H01L 24/81 |
| 2020/0066592 A1 * | 2/2020 | Seddon | H01L 21/0445 |
| 2020/0105676 A1 * | 4/2020 | Jin | H01L 24/73 |
| 2021/0202363 A1 * | 7/2021 | Chang Chien | H01L 23/3128 |
| 2021/0217676 A1 * | 7/2021 | Yeh | H01L 25/0655 |
| 2021/0384100 A1 * | 12/2021 | Ryu | H01L 25/0655 |

FOREIGN PATENT DOCUMENTS

| | | | | |
|---|---|---|---|---|
| KR | 20190023285 A | * | 3/2019 | |
| KR | 20190036264 A | * | 4/2019 | |
| KR | 20190089623 A | * | 7/2019 | ............ H01L 25/18 |
| KR | 101901711 B1 | * | 11/2019 | |
| KR | 102041661 B1 | * | 11/2019 | |
| KR | 20200046627 A | * | 5/2020 | |
| KR | 20200048352 A | * | 5/2020 | |
| KR | 20200055438 A | * | 5/2020 | |
| TW | 201701339 A | | 1/2017 | |

* cited by examiner

SEMICONDUCTOR DIE WITH TAPERED SIDEWALL IN PACKAGE

BACKGROUND

Semiconductor devices and integrated circuits are typically manufactured on a single semiconductor wafer. The semiconductor dies of the wafer may be processed and packaged with other semiconductor devices or dies at the wafer level, and various technologies have been developed for the wafer level packaging.

Those individual semiconductor dies are formed by sawing the integrated circuits along scribe lines of the semiconductor wafer. The individual semiconductor dies are then packaged separately. The semiconductor industry continues to improve the integration density of various electronic components (e.g., transistors, diodes, resistors, capacitors, etc.) by continual reductions in minimum feature size, which allow more components to be integrated into a given area.

In the packaging of integrated circuits, semiconductor dies may be stacked and bonded to other package components (e.g., interposer substrates and package substrates). However, since feature sizes of semiconductor dies continue to decrease, feature sizes of package components (e.g., interposer substrates) for carrying the semiconductor dies decrease as well. Therefore, it is a challenge to form reliable chip packages.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

FIG. 1E-1 is a cross-sectional view of a chip package structure, in accordance with some embodiments.

DETAILED DESCRIPTION

Figure 1A:
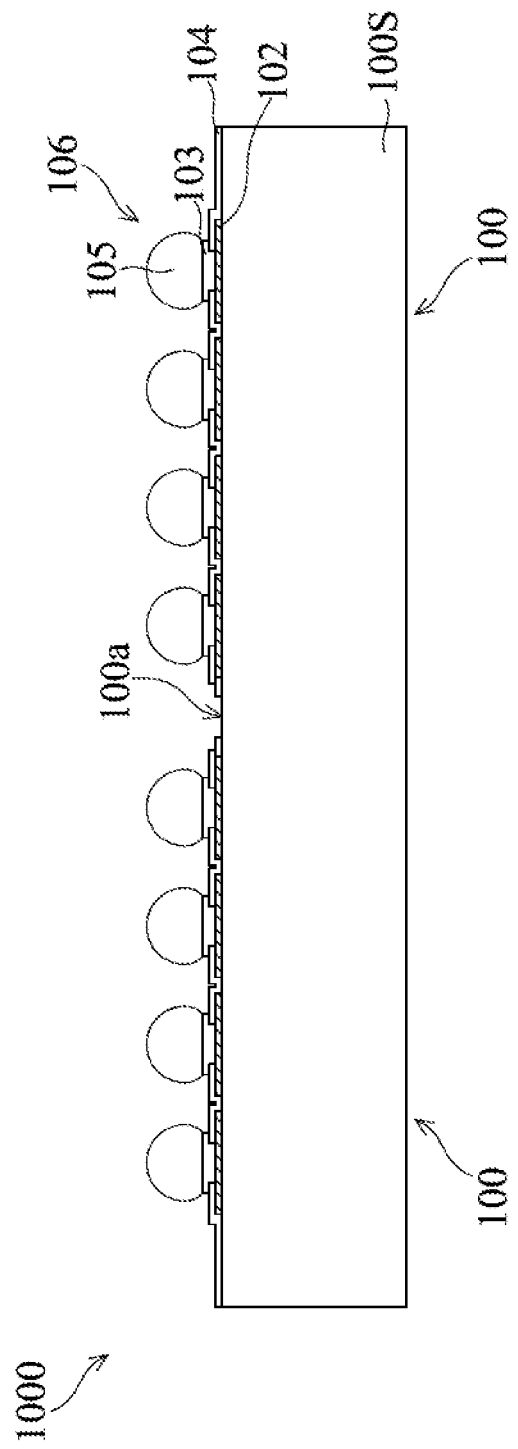
FIGS. 1A-1E are cross-sectional views of various stages of a process for forming a chip package structure, in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The term "substantially" in the description, such as in "substantially flat" or in "substantially coplanar", etc., will be understood by the person skilled in the art. In some embodiments the adjective substantially may be removed. Where applicable, the term "substantially" may also include embodiments with "entirely", "completely", "all", etc. Where applicable, the term "substantially" may also relate to 90% or higher, such as 95% or higher, especially 99% or higher, including 100%. Furthermore, terms such as "substantially parallel" or "substantially perpendicular" are to be interpreted as not to exclude insignificant deviation from the specified arrangement and may include for example deviations of up to 10°. The word "substantially" does not exclude "completely" e.g. a composition which is "substantially free" from Y may be completely free from Y.

Terms such as "about" in conjunction with a specific distance or size are to be interpreted so as not to exclude insignificant deviation from the specified distance or size and may include for example deviations of up to 10%. The term "about" in relation to a numerical value x may mean x±5 or 10%.

Embodiments of the disclosure may relate to 3D packaging or 3D-IC devices. Other features and processes may also be included. For example, testing structures may be included to aid in the verification testing of the 3D packaging or 3D-IC devices. The testing structures may include, for example, test pads formed in a redistribution layer or on a substrate that allows the testing of the 3D packaging or 3D-IC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

Some embodiments of the disclosure are described. FIGS. 1A to 1E are cross-sectional views of various stages of a process for forming a chip package structure, in accordance with some embodiments. Additional operations can be provided before, during, and/or after the stages described in FIGS. 1A to 1E. Some of the stages that are described can be replaced or eliminated for different embodiments. Additional features can be added to the semiconductor device structure. Some of the features described below can be replaced or eliminated for different embodiments. Although some embodiments are discussed with operations performed in a particular order, these operations may be performed in another logical order.

As shown in FIG. 1A, a semiconductor wafer 1000 is provided. The semiconductor wafer 1000 includes semiconductor chips (which are also referred to as semiconductor dies when sawed apart). In order to simplify the diagram, only two adjacent semiconductor chips/dies 100 are depicted. In some embodiments, the semiconductor chip/die 100 provides logic functions for the structures. For example the semiconductor chip/die 100 is a system-on-chip (SoC) chip, although any suitable semiconductor chip/die may be utilized.

The semiconductor wafer 1000 (and dies 100 therein) may include a semiconductor substrate 100s. The semiconductor substrate 100s may include bulk silicon, doped or undoped, or an active layer of a silicon-on-insulator (SOI) substrate. Generally, an SOI substrate includes a layer of a semiconductor material such as silicon, germanium, silicon germanium, or combinations thereof. The semiconductor substrate 100s may include integrated circuit devices (not shown) and an interconnect structure (not shown). The integrated circuit devices may include active devices (e.g., transistors). The active devices may be formed using any suitable methods either within or else on the semiconductor substrate 100s. In some embodiments, the interconnect structure is formed over the semiconductor substrate 100s and the active devices and are designed to connect the various active devices to form functional circuitry. In some embodiments, the interconnect structure is formed of alternating layers of dielectric and conductive material and may be formed through any suitable process (such as deposition, damascene, dual damascene, etc.). The dielectric layers may include low-k dielectric layers, for example, with k values lower than about 3.0.

In some embodiments, conductive pads 102 are formed at the front surface 100a (which is also referred to as an active surface) of the semiconductor substrate 100s, and are electrically coupled to integrated circuit devices through the interconnect structure. In some embodiments, the conductive pads 102 are bonding pads. The conductive pads 102 may be made of metals such as aluminum, copper, nickel, gold, and combinations thereof. The conductive pads 102 may be formed using a deposition process, such as sputtering, to form a layer of material and the layer of material may then be patterned via a suitable process (such as lithography and etching) to form the contact pads.

In some embodiments, conductive pillars 103, such as copper pillars, copper alloy pillars, or other suitable metal pillars, are formed on conductive pads 102. The conductive pillars 103 are formed on conductive pads 102. For example, the conductive pillars 103 may be formed by initially placing a photoresist and then patterning the photoresist into the desired pattern for the conductive pillars. A plating process is then utilized to form the conductive material (e.g., copper) in connection with the conductive pads 102. However, any suitable methods may be utilized.

In some embodiments, a passivation layer 104 is formed to cover the active surface 100a of the semiconductor substrate 100s and a portion of the conductive pad 102. The material of passivation layer 104 may be selected from solder resists, a polymer such as polyimide (PI), polybenzoxazole (PBO), benzocyclobutene (BCB), molding compound, and the like. Alternatively, the material of passivation layer 104 may be selected from silicon oxide, silicon oxynitride, silicon nitride, silicon carbide, another suitable material, or a combination thereof.

In some embodiments, the conductive pillars 103 protrude out of the passivation layer 104. In some other embodiments, the conductive pillars 103 are embedded in the passivation layer 104.

In some embodiments, after the conductive pillars 103 are formed, electrical connectors 105 (e.g., microbumps) are correspondingly bonded on the conductive pillars 103 of the semiconductor wafer 1000. For example, the electrical connectors 105 may be solder balls and formed on the conductive pillars 103 using a ball-mounting head (not shown). The electrical connectors 105 may be made of a material such as tin, silver, lead-free tin, or copper. The conductive pillar 103 and the overlying electrical connector 105 form a bump structure 106 that serves as an electrical connection between the semiconductor die 100 and an external circuit (not shown).

Figure 1B:
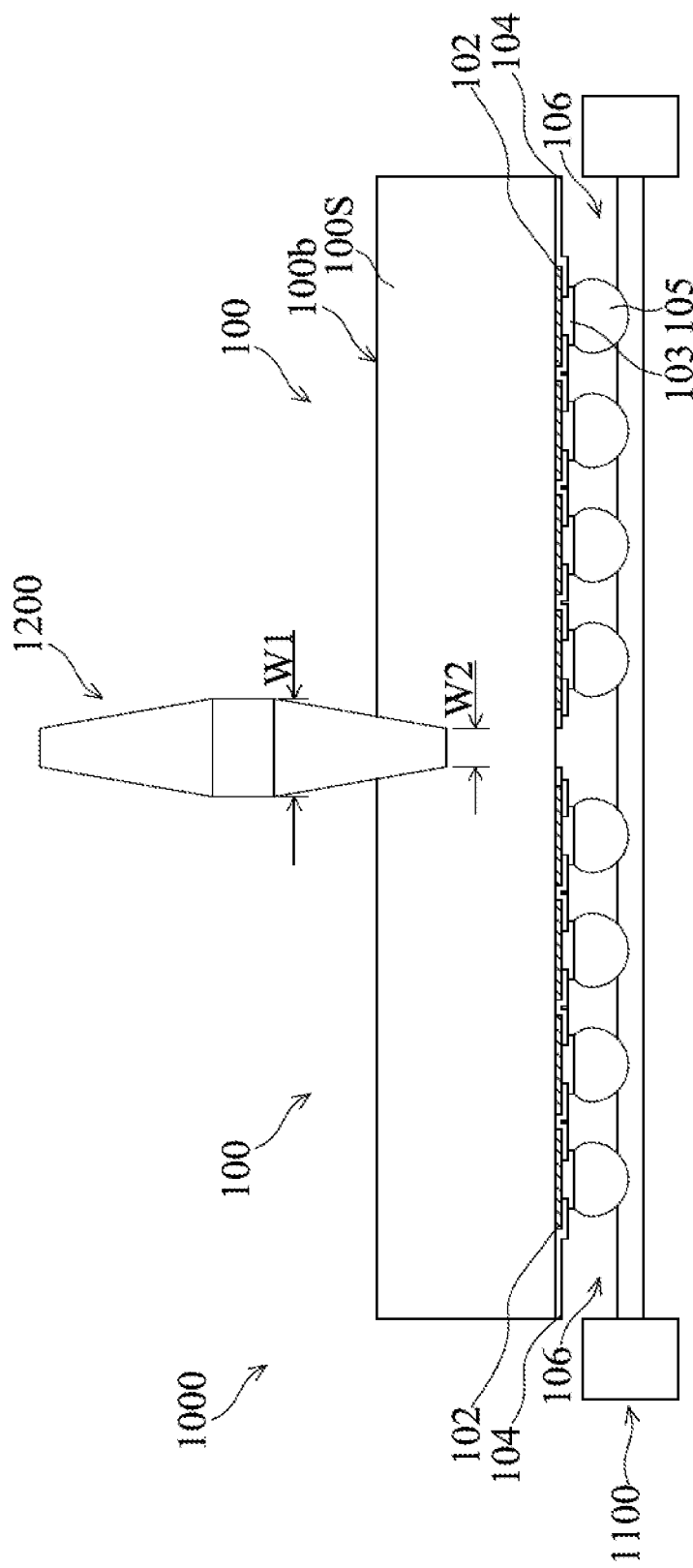
Figure 1C:
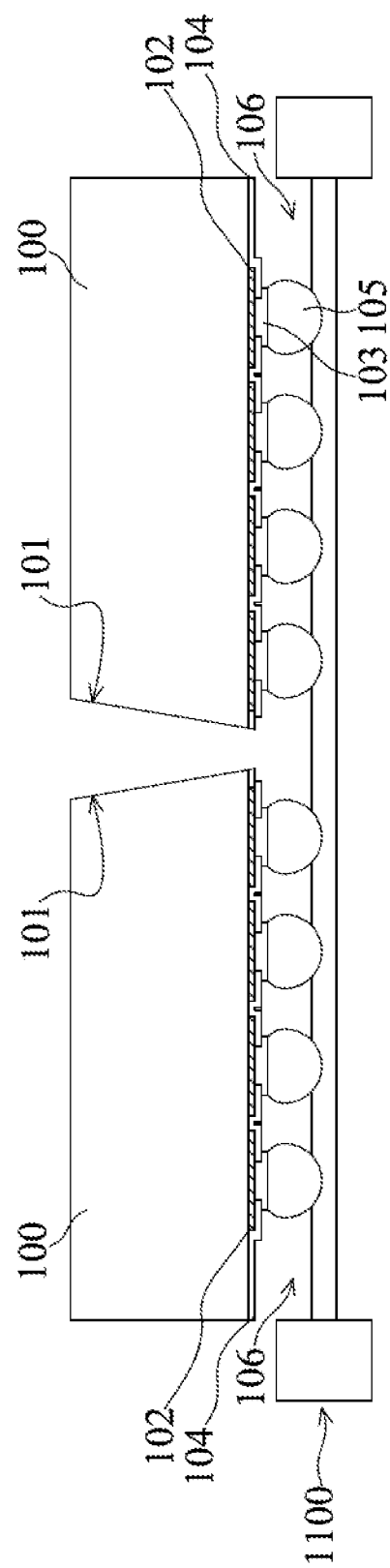

After the bump structures 106 are formed, singulated semiconductor dies 100 are formed, as shown in FIGS. 1B to 1C in accordance with some embodiments. As shown in FIG. 1B, the semiconductor wafer 1000 is flipped to attach the bump structures 106 on a carrier 1100, in accordance with some embodiments. The carrier 1100 may include a tape layer which serves as a temporary carrier tape and is easily detached from the bump structures 106.

Afterwards, the rear surface 100b (which is also referred to as a non-active surface) of semiconductor wafer 1000 is diced along the scribe lines (not shown) of the semiconductor wafer 1000 by a sawing process, an etching process, or a combination thereof. For example, the rear surface 100b of semiconductor wafer 1000 may be diced by a sawing process using one or more blades. In those cases, at least one blade 1200 is used during the sawing process, as shown in FIG. 1B, in which the thickness or width W1 at the center of the blade 1200 is greater than the thickness or width W2 at the edge of the blade 1200. The thickness of the blade 1200 is reduced gradually from the center of the blade 1200 to the edge of the blade 1200. As a result, the formed semiconductor dies 100 have at least one sidewall with a non-vertical contour, such as a tapered contour.

After the semiconductor wafer 1000 is diced, the semiconductor dies 100 are separated from each other, as shown in FIG. 1C in accordance with some embodiments. As a result of the sawing process, in each of the resulting semiconductor dies 100, at least a sidewall 101 of each semiconductor die 100 has a tapered contour between the two adjacent semiconductor dies 100 when the blade 1200 (as shown in FIG. 1B) is used in the sawing process. In some other embodiments, each of the sidewalls of the singulated semiconductor die 100 has the tapered contour.

Figure 1D:
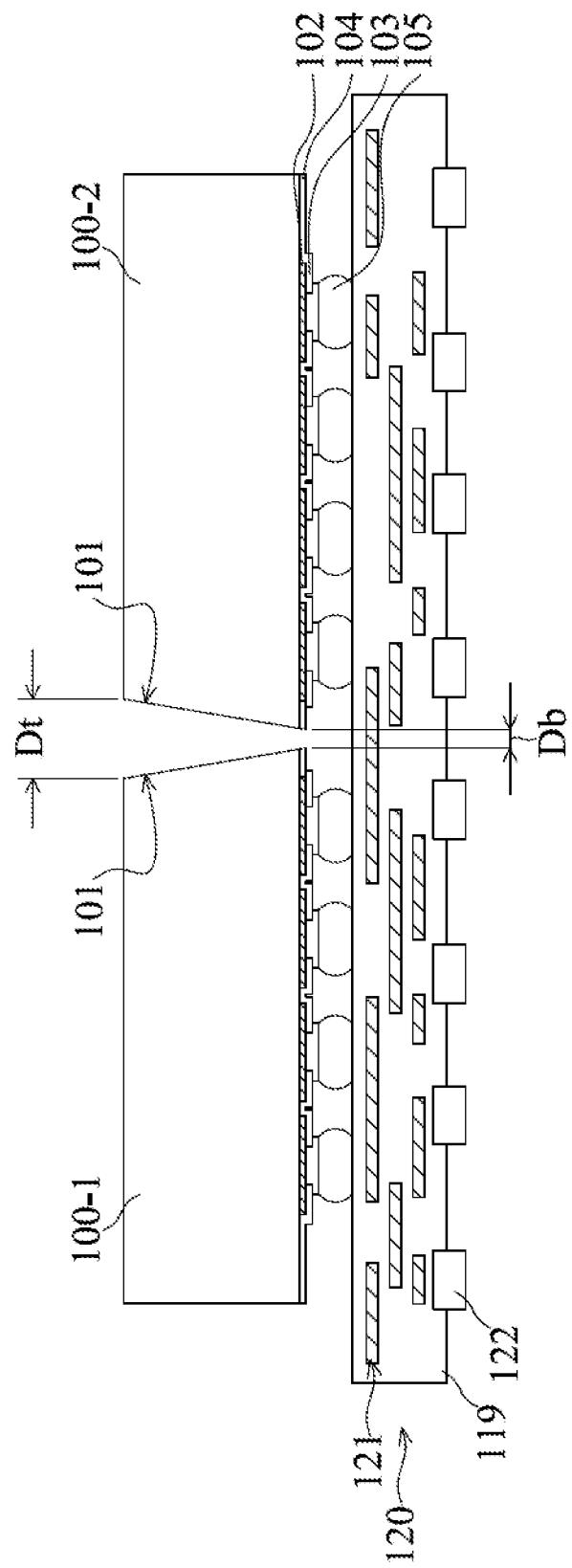

After the singulated semiconductor dies 100 are formed, an interposer substrate 120 is provided and is ready to be bonded with the interconnect structure of at least two semiconductor dies 100 shown in FIG. 1C, as shown in FIG. 1D in accordance with some embodiments. In some embodiments, the interposer substrate 120 includes a redistribution layer (RDL) structure 121 that is formed in a base layer 119 and covered by a passivation layer 122. The redistribution layer (RDL) structure 121 may be used as a fan-out RDL structure for routing.

More specifically, the redistribution structure 121 includes one or more conductive layers (such as two or three conductive layers) embedded within one or more dielectric layers (which form the base layer 119). The redistribution structure 121 provides not only conductive routing for signals, but may also provide structures such as integrated inductors or capacitors. In some embodiments, the dielectric layers include an organic material such as polybenzoxazole (PBO), polyimide (PI), one or more other suitable polymer materials, or a combination thereof. In those cases, the interposer substrate 120 is also referred to as an organic substrate or an organic interposer. The dielectric layers may be formed by, e.g., a spin-coating process, although any suitable method may be used. After the first of the dielectric layers has been formed, openings (not shown) may be made through the first dielectric layer.

Once the first dielectric layer has been formed and patterned, the first of the conductive layers (such as copper) is formed over the first dielectric layer and through the openings that were formed within the first dielectric layer. In some embodiments, the first conductive layer is formed using a suitable formation process, such as electroplating, chemical vapor deposition (CVD) or sputtering. However, while the material and methods discussed are suitable to form the conductive layer, this material is merely exemplary. Any other suitable materials, such as aluminum, tungsten, nickel, titanium, gold, platinum, silver, another suitable material, or a combination thereof, and any other suitable processes of formation, such as CVD or physical vapor deposition (PVD), may be used to form the conductive layers.

Once the first conductive layer has been formed, a second dielectric layer and a second conductive layer may be formed by repeating steps that are similar to the steps for the first dielectric layer and first conductive layer. These steps may be repeated as desired in order to form an electrical connection between the conductive layers. In some embodiments, the deposition and patterning of the conductive layers and the dielectric layers may be continued until the redistribution structure 121 has the desired number of conductive layers.

The passivation layer 122 may be a single layer or a multi-layer structure. In some embodiments, the passivation layer 122 is a single layer and has openings exposing conductive layers of the redistribution structure 121. Bond pads (not shown) may be formed over the exposed redistribution structure 121. The passivation layer 122 is made of dielectric material(s) and provides stress relief for bonding stress incurred during subsequent bonding processes. For example, the passivation layer 122 may be made of a polymer material, such as polyimide, PBO, BCB, the like, or a combination thereof. Alternatively or additionally, the passivation layer 122 may include silicon oxide, silicon oxynitride, silicon nitride, silicon carbide, another suitable material, or a combination thereof.

Multiple deposition, coating, and/or etching processes may be used to form the interposer substrate 120 including the redistribution structure 121 and the passivation layer 122. In some embodiments, one or more thermal processes are performed during the formation the interposer substrate 120. For example, portions of the passivation layer 122 may be made of a polymer material that is formed using a process involving a thermal operation.

After the interposer substrate 120 is provided, at least two semiconductor dies 100 are removed from the carrier 1100 and placed over the interconnect structure 110 using, for example, a pick and place tool (not shown) and then the bump structures 106 of the semiconductor dies 100 are mounted over the interposer substrate 120.

For example, two homogeneous semiconductor dies 100 (which are referred to as first semiconductor die 100-1 and second semiconductor die 100-2) may be mounted over the interposer substrate 120 through the bump structures 106. For example, both of the first semiconductor die 100-1 and second semiconductor die 100-2 are SoC dies. Optional under bump metallization (UBM) layers (not shown) and the overlying solder bump structures (not shown) may be correspondingly formed below the bump structures 106 and on the interposer substrate 120 prior to the placement of the first semiconductor die 100-1 and the second semiconductor dies 100-2.

In some embodiments, the first semiconductor die 100-1 and the second semiconductor dies 100-2 are arranged in a side by side manner. Moreover, the sidewall 101 of the first semiconductor die 100-1 faces to and spaced apart from the sidewall 101 of the second semiconductor die 100-2. As a result, the contours of the sidewalls 101 of the first semiconductor die 100-1 and the second semiconductor dies 100-2 are symmetric with respect to a central line of the space between the sidewall 101 of the first semiconductor die 100-1 and the sidewall 101 of the second semiconductor die 100-2.

As shown in FIG. 1D, the sidewalls 101 of the first semiconductor die 100-1 and the second semiconductor dies 100-2 are tapered from the active surface of the first semiconductor die 100-1 and the second semiconductor dies 100-2 toward the non-active surface thereof. Therefore, a lateral distance from a top end of the sidewall 101 of the first semiconductor die 100-1 to a top end of the sidewall 101 of the second semiconductor die 100-2 is greater than a lateral distance from a bottom end of the sidewall 101 of the first semiconductor die 100-1 to a bottom end of the sidewall 101 of the second semiconductor die 100-2. The lateral distance from a top end of the sidewall 101 of the first semiconductor die 100-1 to a top end of the sidewall 101 of the second semiconductor die 100-2 is defined as a top die-to-die distance Dt (which is sometimes referred to as top die-to-die gap). The lateral distance from a bottom end of the sidewall 101 of the first semiconductor die 100-1 to a bottom end of the sidewall 101 of the second semiconductor die 100-2 is defined as a bottom die-to-die distance Db (which is sometimes referred to as bottom die-to-die gap). Therefore, the top die-to-die distance Dt is greater than the bottom die-to-die distance Db.

Figure 1E:
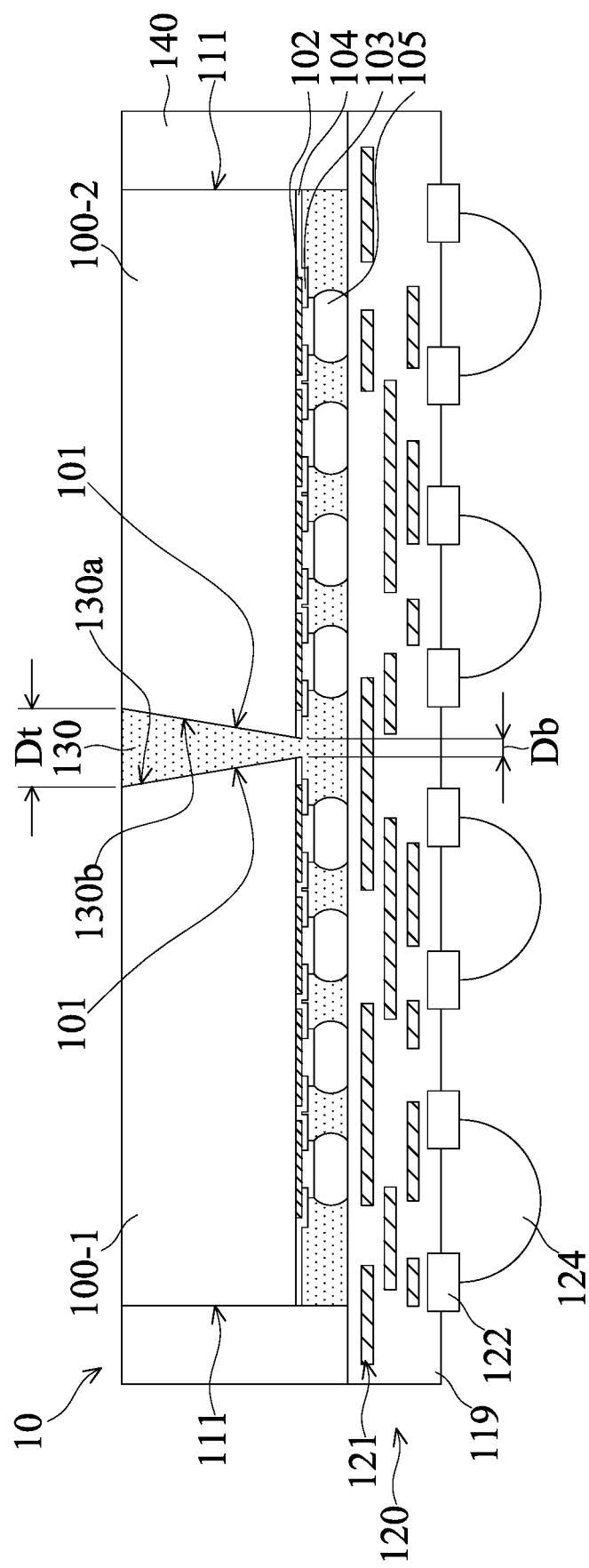

After the first semiconductor die 100-1 and the second semiconductor dies 100-2 are bonded onto the interposer substrate 120, an insulating layer (which is also referred to as encapsulating layer or package layer) is formed over the interposer substrate 120 to cover the first semiconductor die 100-1 and the second semiconductor dies 100-2, in accordance with some embodiments. More specifically, as shown in FIG. 1E, the insulating layer includes a first portion 140 and a second portion 130. The first portion 140 of the insulating layer surrounds the first semiconductor die 100-1 and the second semiconductor dies 100-2. The second portion 130 extends between the sidewall 101 of the first semiconductor die 100-1 and the sidewall 101 of the second semiconductor die 100-2, between the interposer substrate 120 and the first semiconductor die 100-1, and between the interposer substrate 120 and the second semiconductor die 100-2. In some embodiments, the second portion 130 of the insulating layer may also cover portions of the outer sidewalls 111 of the first semiconductor die 100-1 and the outer sidewalls 111 of the second semiconductor die 100-2.

In some embodiments, the first portion 140 of the insulating layer is made of a material that is different than that of the second portion 130 of the insulating layer. More specifically, the first portion 140 of the insulating layer is made of a polymer material or a molding compound material, and the second portion 130 of the insulating layer is made of an underfill material.

In those cases, the underfill material layer (e.g., the second portion 130 of the insulating layer) is employed to protect and support the semiconductor die from operational and environmental degradation, such as stresses caused by the generation of heat during operation. The underfill material may be made of an epoxy-based resin or other protective material. In some embodiments, the formation of the underfill material layer involves an injecting process, a dispensing process, a film lamination process, one or more other applicable processes, or a combination thereof. In some embodiments, a thermal curing process is then used to cure the underfill material layer.

In some embodiments, after the underfill material layer is formed, the polymer or molding compound material layer (e.g., the first portion 140 of the insulating layer) is formed to partially encapsulate the first semiconductor die 100-1 and the second semiconductor die 100-2, so that the sidewalls 111 of the first semiconductor die 100-1 and the second semiconductor die 100-2 uncovered by the underfill material layer are covered by the polymer or molding compound material layer. For example, top surfaces of the first semiconductor die 100-1 and the second semiconductor die 100-2 are exposed from the top surface of the polymer or molding compound material layer.

In some embodiments, the first portion 140 of the insulating layer includes a molding compound. For example, a liquid molding compound material is applied over the interposer substrate 120, the first semiconductor die 100-1, and the second semiconductor die 100-2. Afterwards, a thermal process is then applied to harden the liquid molding compound material.

Afterwards, the hardened molding compound material layer is etched back to expose the top surfaces of the second portion 130 of the insulating layer (e.g., the underfill material layer), the first semiconductor die 100-1, and the second semiconductor die 100-2, in accordance with some embodiments. For example, a planarization process may be used to thin the hardened molding compound material layer (e.g., the first portion 140 of the insulating layer). The planarization process may include a grinding process, a chemical mechanical polishing (CMP) process, an etching process, another applicable process, or a combination thereof. As a result, the top surfaces of the first portion 140 of the insulating layer, the second portion 130 of the insulating layer, the first semiconductor die 100-1, and the second semiconductor die 100-2 are substantially coplanar.

After the planarization process, electrical connectors 124 (e.g., controlled collapse chip connection (C4) bumps) are formed in the passivation layer 122 of the interposer substrate 120 to form a chip package structure 10, as shown in FIG. 1E in accordance with some embodiments. More specifically, the electrical connectors 124 may be solder balls and formed in the openings of the passivation layer 122 that exposes bond pads (not shown) of the redistribution structure 121 by using a ball-mounting head (not shown). The electrical connectors 124 may have a size that is larger than that of the electrical connectors 105. The electrical connectors 124 may be made of a material such as tin, silver, lead-free tin, or copper. The electrical connectors 124 serve as an electrical connection between the interposer substrate 120 and an external circuit (not shown). Optional under bump metallization (UBM) layers (not shown) may be correspondingly formed between the bond pads of the redistribution structure 121 and the electrical connectors 124.

In the chip package structure 10, the second portion 130 of the insulating layer (i.e., the underfill material layer) between the first semiconductor die 100-1 and the second semiconductor die 100-2 has a first sidewall 130a and a second sidewall 130b opposite the first sidewall 130a. In some embodiments, the first sidewall 130a is in direct contact with the sidewall 101 of the first semiconductor die 100-1 and the second sidewall 130b is in direct contact with the sidewall 101 of the second semiconductor die 100-2. As a result, the first sidewall 130a has the same contour as that of the sidewall 101 of the first semiconductor die 100-1, and the second sidewall 130b has the same contour as that of the sidewall 101 of the second semiconductor die 100-1. Therefore, the contour of the first sidewall 130a and the contour of the second sidewall 130b are symmetric with respect to a central line of the second portion 130 of the insulating layer that is between the first semiconductor die 100-1 and the second semiconductor die 100-2. Moreover, the second portion 130 of the insulating layer between the first semiconductor die 100-1 and the second semiconductor die 100-2 has a top width that is substantially equal to the top die-to-die distance Dt, and a bottom width that is substantially equal to the bottom die-to-die distance Db.

In other words, the sidewall 101 of the first semiconductor die 100-1 tilts towards both the top surface of the second portion 130 (opposite to the interposer substrate 120) and the sidewall 101 of the second semiconductor die 100-2. The sidewall 101 of the second semiconductor die 100-2 tilts towards both the top surface of the second portion 130 (opposite to the interposer substrate 120) and the sidewall 101 of the first semiconductor die 100-1. An upper horizontal section of the top portion of the second portion 130 is lager than a lower horizontal section of the bottom portion of the second portion 130.

In some other embodiments, one or more additional insulating layers (not shown) are formed between the sidewall 101 of the first semiconductor die 100-1 and the first sidewall 130a of the second portion 130. Moreover, one or more additional insulating layers (not shown) is formed between the sidewall 101 of the second semiconductor die 100-2 and the second sidewall 130b of the second portion 130. In those cases, the first sidewall 130a is not in direct contact with the sidewall 101 of the first semiconductor die 100-1 and the second sidewall 130b is not in direct contact with the sidewall 101 of the second semiconductor die 100-2. The first sidewall 130a may have a contour as similar to that of the sidewall 101 of the first semiconductor die 100-1, and the second sidewall 130b may have a contour similar to that of the sidewall 101 of the second semiconductor die 100-1. Therefore, the contour of the first sidewall 130a and the contour of the second sidewall 130b are symmetric with respect to a central line of the second portion 130 of the insulating layer. Moreover, the second portion 130 of the insulating layer between the first semiconductor die 100-1 and the second semiconductor die 100-2 has a top width and a bottom width that are defined by the first sidewall 130*a* and the second sidewall 130*b*. The top width of the second portion 130 of the insulating layer is greater than the bottom width of the portion 130 of the insulating layer.

After the electrical connectors 124 are formed, a flux-dipping process is performed on the electrical connectors 124 at a room temperature in accordance with some embodiments, so as to form flux layers covering respective electrical connectors 124. Afterwards, a flip chip bonding (FCB) process is performed on the electrical connectors 124 at high temperature, so as to bond the structure shown in FIG. 1E to a package substrate (not shown) that is used for connecting an external circuit (not shown).

During the flux-dipping process and the subsequent FCB process, the second portion 130 of the insulating layer between the first semiconductor die 100-1 and the second semiconductor die 100-2 may serve as a buffer layer to mitigate the coefficients of thermal expansion (CTE) mismatch between the first and second semiconductor dies 100-1 and 100-2 and the interposer substrate 120. In some embodiments, the top die-to-die distance Dt is enlarged as compared to the bottom die-to-die distance Db. In some embodiments, the top die-to-die distance Dt is substantially equal to or greater than 1.75 times the bottom die-to-die distance Db (i.e., Dt □01.75 Db). When the ratio of the top die-to-die distance Dt to the bottom die-to-die distance Db is substantially equal to or greater than 1.75, a larger shrinkage effect induced by the buffer layer during the flux-dipping process and a larger expansion effect induced by the buffer layer during the FCB process can be obtained than the case that the top die-to-die distance Dt is not enlarged as compared to the bottom die-to-die distance Db. As a result, package warpage due to the CTE mismatch between the first and second semiconductor dies 100-1 and 100-2 and the interposer substrate is reduced. Therefore, the non-uniform flux (or no flux) problem after the flux-dipping process can be addressed or mitigated, thereby increasing the flux-dipping process window. Also, the cold joint and bridge problems after the FCB process can be addressed or mitigated, thereby increasing device yield after the FCB process.

In some embodiments, smaller bottom die-to-die distance Db is maintained, as compared to the enlarged top die-to-die distance Dt. Therefore, a smaller shrinkage effect induced by the buffer layer during the flux-dipping process and a smaller expansion effect induced by the buffer layer during the FCB process can be obtained than the case that the top die-to-die distance Dt is not enlarged as compared to the bottom die-to-die distance Db. The tensile-stress in the redistribution layer (RDL) structure 121 induced from the interposer substrate 120 is mitigated. Therefore, the fin-line trace crack issue is addressed or mitigated, thereby improving the reliability of the redistribution layer (RDL) structure 121.

Figures 1, 1E:
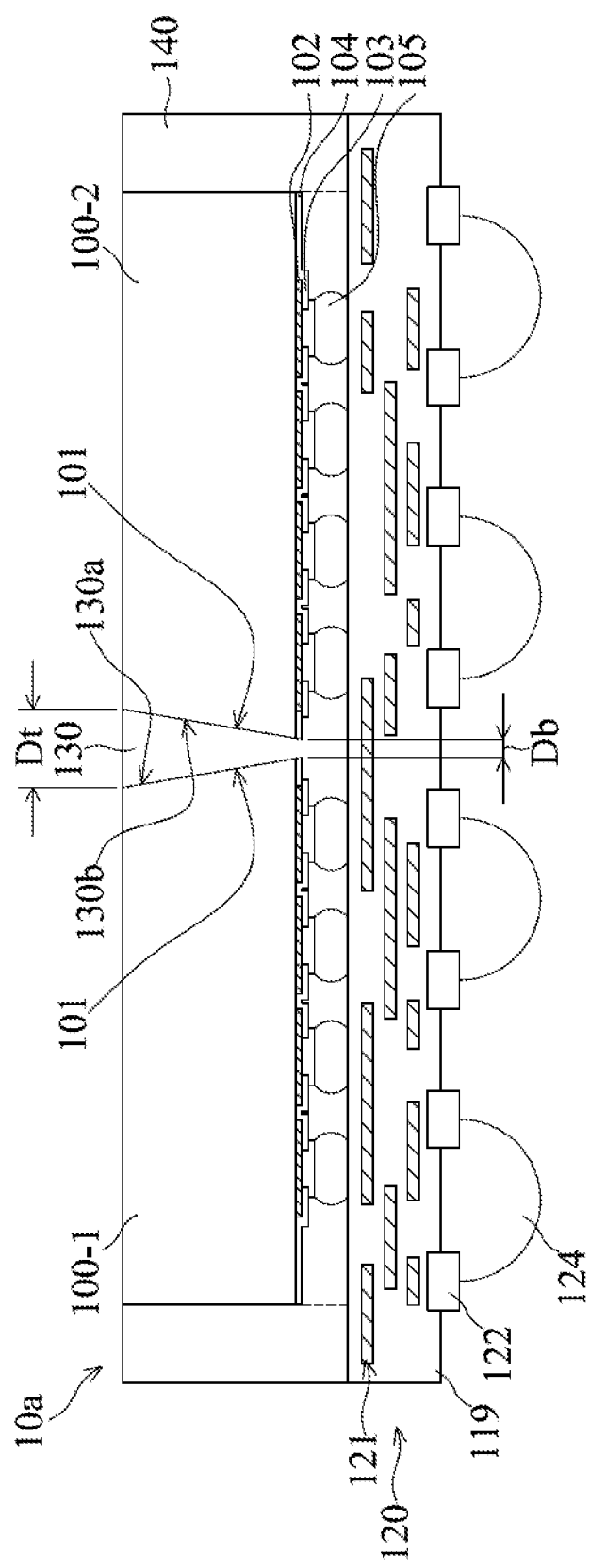

Many variations and/or modifications can be made to embodiments of the disclosure. For example, the chip package structure 10 shown in FIG. 1E employs an underfill material layer to serve as a buffer layer, but embodiments of the disclosure are not limited thereto. FIG. 1E-1 shows a cross-sectional view of a chip package structure 10*a*, in accordance with some embodiments. The chip package structure 10*a* shown in FIG. 1E-1 is similar to the chip package structure 10 shown in FIG. 1E. In some embodiments, the materials, formation methods, and/or benefits of the chip package structure 10 shown in FIGS. 1A to 1E can also be applied in the embodiments illustrated in FIG. 1E-1, and are therefore not repeated. Unlike the chip package structure 10 shown in FIG. 1E, the insulating layer (i.e., the encapsulating layer or package layer) in the chip package structure 10*a* shown in FIG. 1E-1 includes a homogeneous material. More specifically, the first portion 140 of the insulating layer is made of a polymer material layer or a molding compound material layer that is the same as that of the second portion 130 of the insulating layer (e.g., the buffer layer).

Many variations and/or modifications can be made to embodiments of the disclosure. For example, the first semiconductor die 100-1 and the second semiconductor die 100-2 in the chip package structure 10 shown in FIG. 1E have the sidewall 101 with a tapered contour, but embodiments of the disclosure are not limited thereto. FIGS. 2 to 6 show cross-sectional views of various chip package structure 20, 30, 30*a*, 40, and 40*a*, in accordance with some embodiments. Those chip package structures 20, 30, 30*a*, 40, and 40*a* are similar to the chip package structure 10 shown in FIG. 1E. The materials, formation methods, and/or benefits of the chip package structure 10 shown in FIGS. 1A to 1E may also be applied in the embodiments illustrated in FIGS. 2 to 6, and are therefore not repeated.

Figure 2:
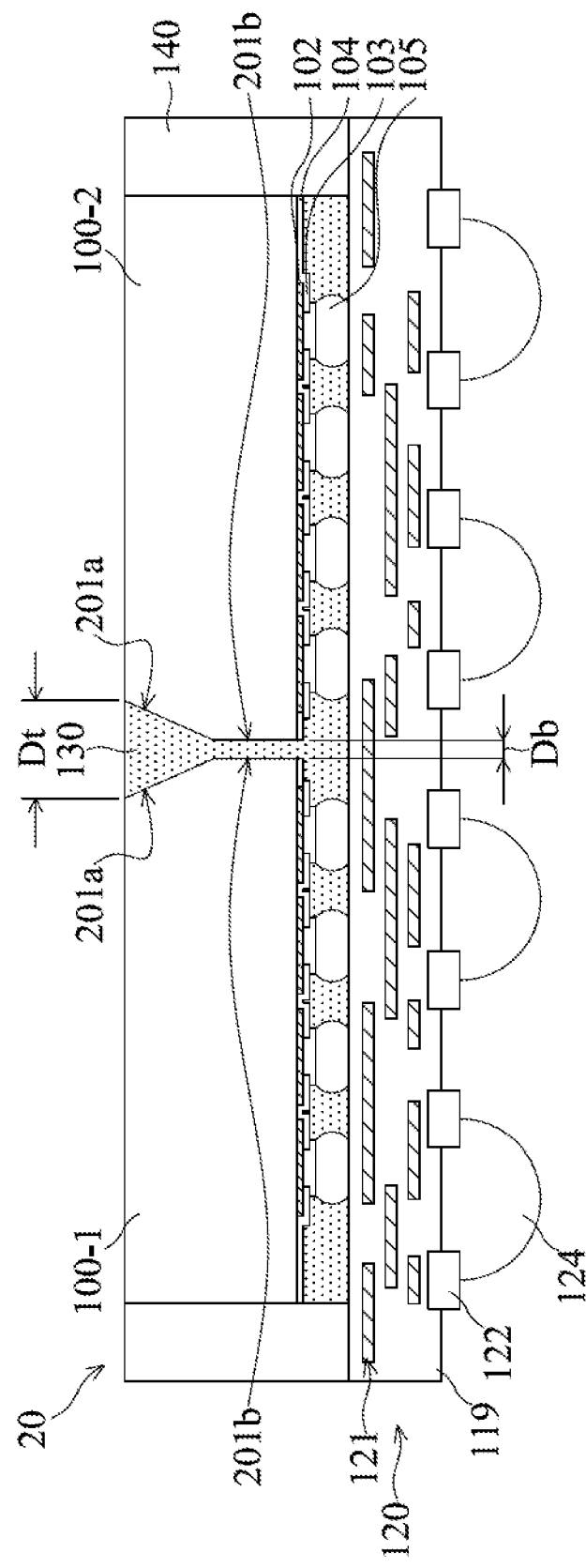
FIG. 2 is a cross-sectional view of a chip package structure, in accordance with some embodiments.

Unlike the tapered sidewalls 101 of the first and second semiconductor dies 100-1 and 100-2 in the chip package structure 10 shown in FIG. 1E, each of the first and second semiconductor dies 100-1 and 100-2 in the chip package structure 20 shown in FIG. 2 has a sidewall including an upper portion 201*a* and a lower portion 201*b* extending from the bottom of the upper portion 201*a*. The upper portion 201*a* of the sidewall has a tapered contour and the lower portion 201*b* of the sidewall has a vertical contour.

Figure 3:
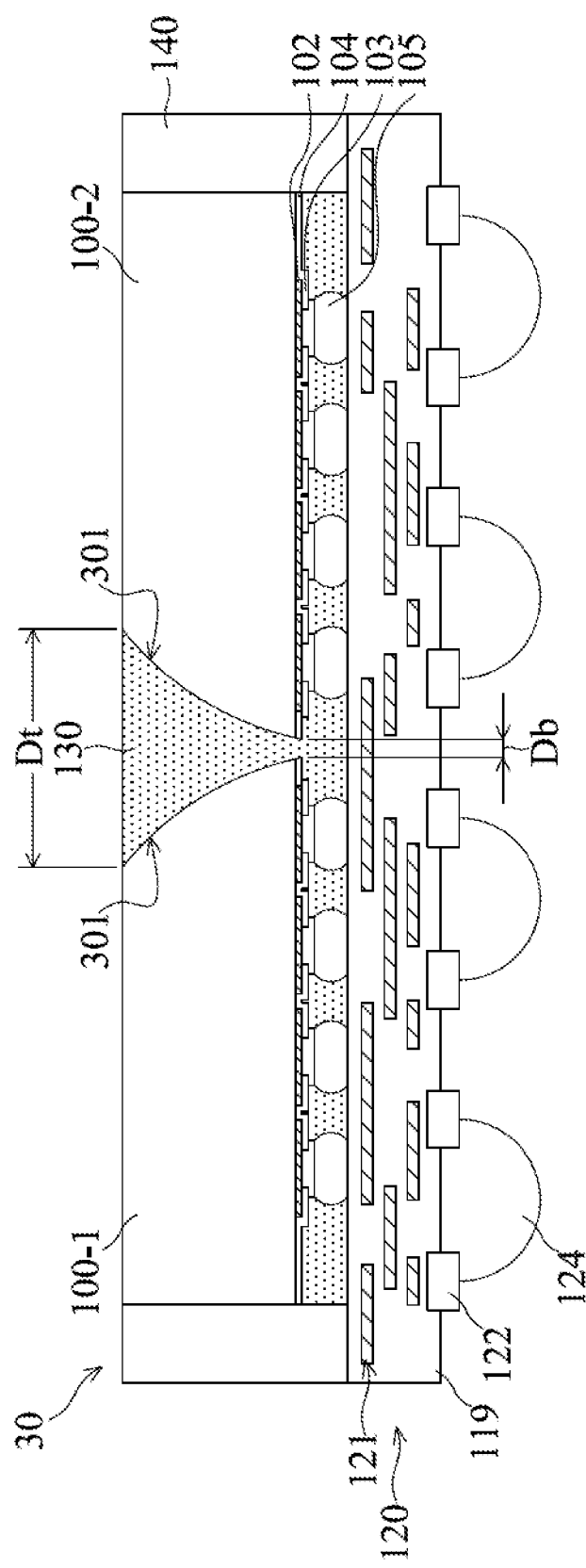
FIG. 3 is a cross-sectional view of a chip package structure, in accordance with some embodiments.

Unlike the tapered sidewalls 101 of the first and second semiconductor dies 100-1 and 100-2 in the chip package structure 10 shown in FIG. 1E, each of the first and second semiconductor dies 100-1 and 100-2 in the chip package structure 30 shown in FIG. 3 has a sidewall 301 with a convex contour.

Figure 4:
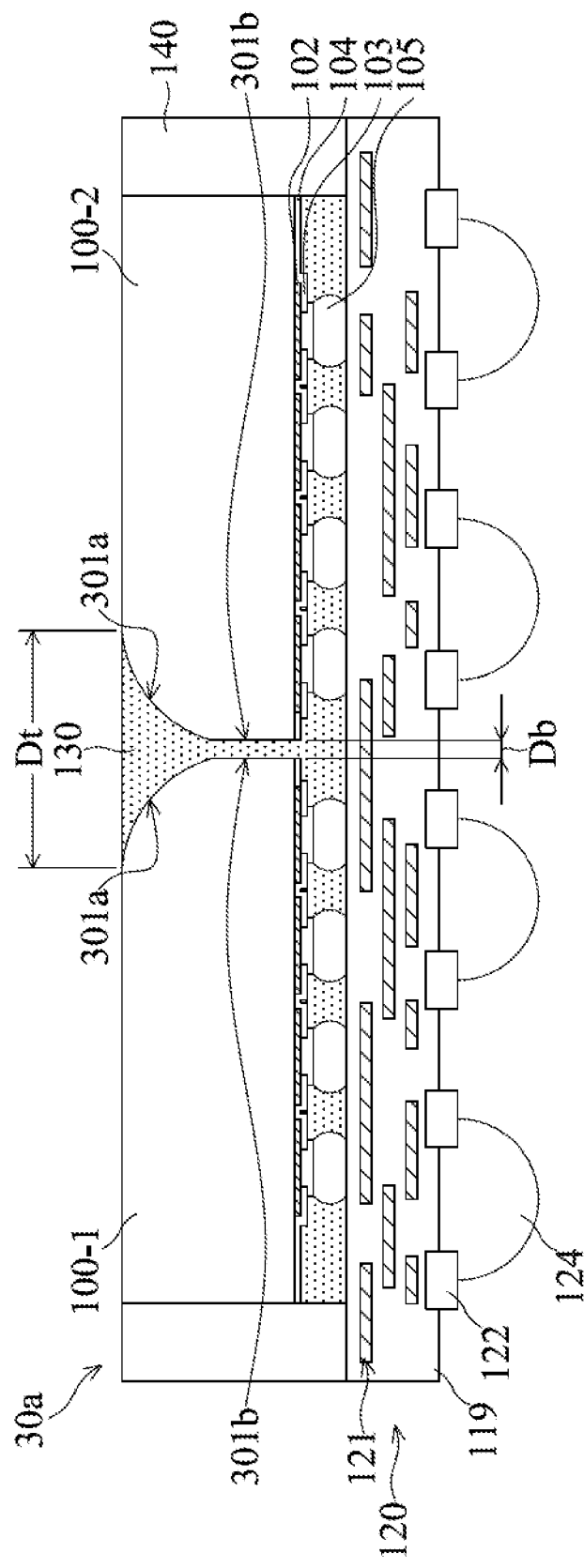
FIG. 4 is a cross-sectional view of a chip package structure, in accordance with some embodiments.

Unlike the convex sidewalls 301 of the first and second semiconductor dies 100-1 and 100-2 in the chip package structure 30 shown in FIG. 3, each of the first and second semiconductor dies 100-1 and 100-2 in the chip package structure 30*a* shown in FIG. 4 has a sidewall including an upper portion 301*a* and a lower portion 301*b* extending from the bottom of the upper portion 301*a*. The upper portion 301*a* of the sidewall has a convex contour and the lower portion 301*b* of the sidewall has a vertical contour.

Figure 5:
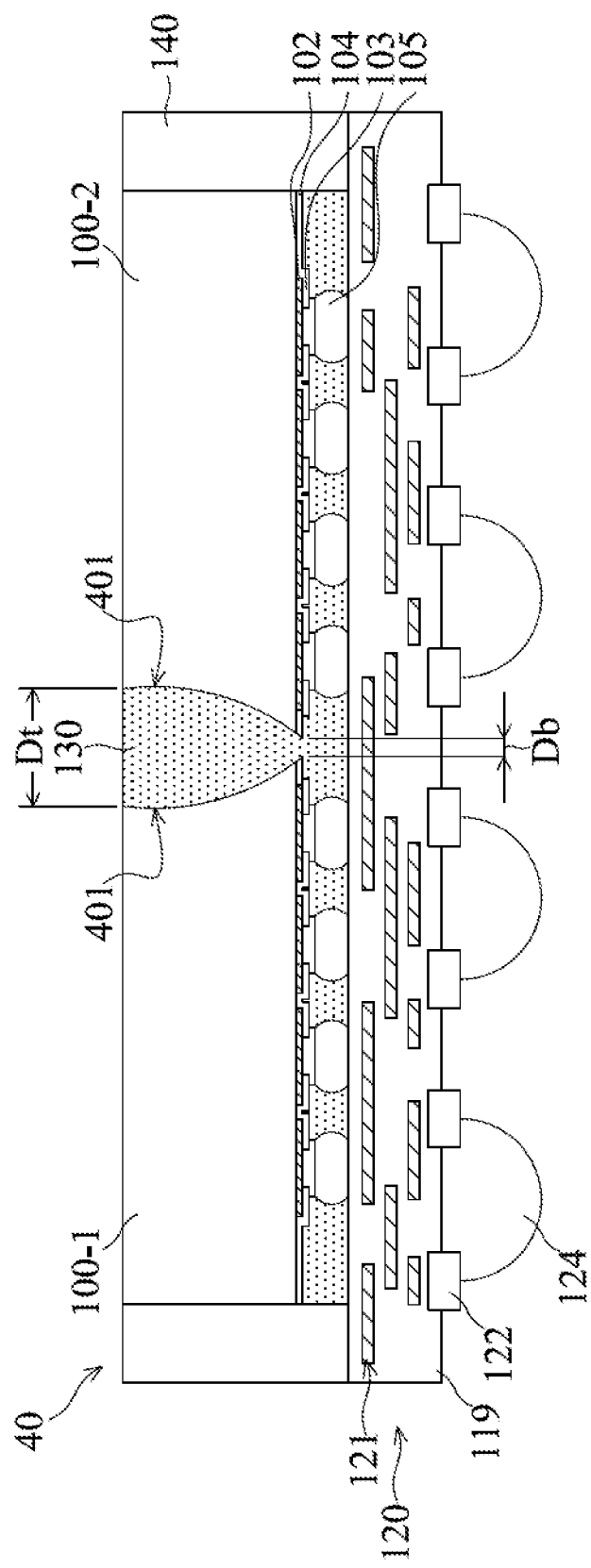
FIG. 5 is a cross-sectional view of a chip package structure, in accordance with some embodiments.

Unlike the tapered sidewalls 101 of the first and second semiconductor dies 100-1 and 100-2 in the chip package structure 10 shown in FIG. 1E, each of the first and second semiconductor dies 100-1 and 100-2 in the chip package structure 40 shown in FIG. 5 has a sidewall 401 with a concave contour.

Figure 6:
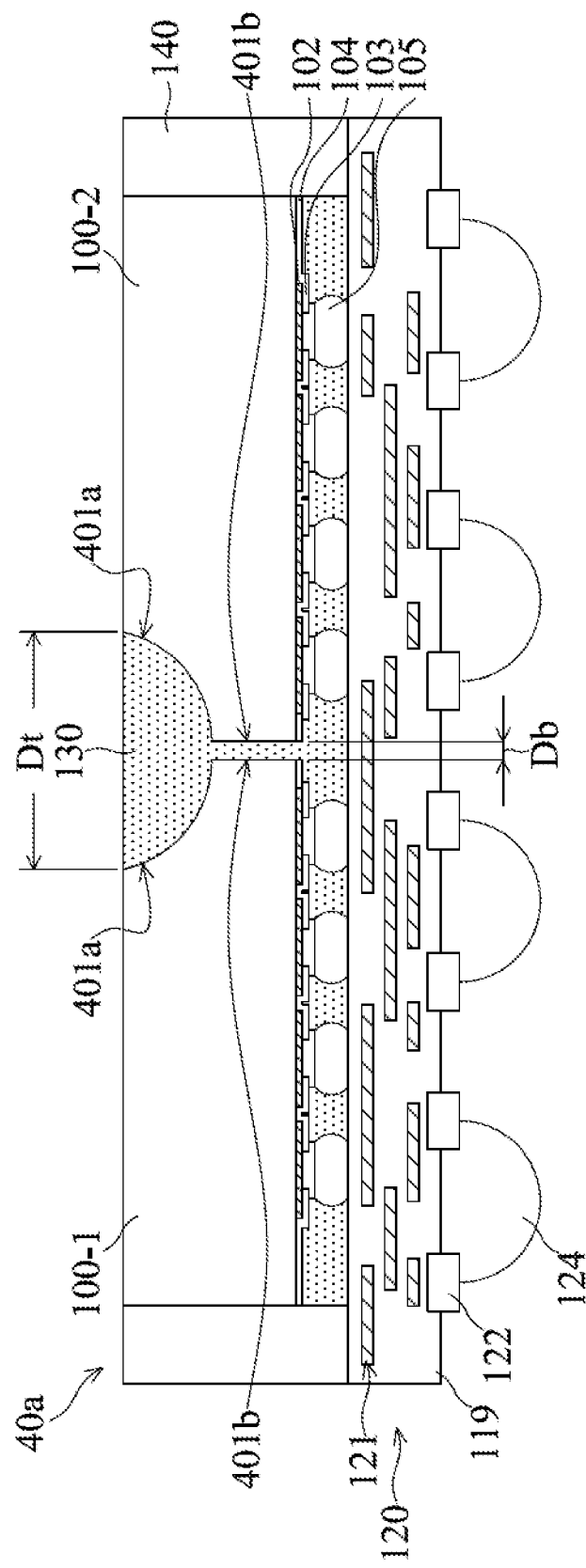
FIG. 6 is a cross-sectional view of a chip package structure, in accordance with some embodiments.

Unlike the convex sidewalls 401 of the first and second semiconductor dies 100-1 and 100-2 in the chip package structure 40 shown in FIG. 5, each of the first and second semiconductor dies 100-1 and 100-2 in the chip package structure 40*a* shown in FIG. 6 has a sidewall including an upper portion 401*a* and a lower portion 401*b* extending from the bottom of the upper portion 401*a*. The upper portion 401*a* of the sidewall has a concave contour and the lower portion 401*b* of the sidewall has a vertical contour.

In some other embodiments, the insulating layer (i.e., the encapsulating layer or package layer) in those chip package structures 20, 30, 30*a*, 40, and 40*a* includes a homogeneous material. More specifically, the first portion 140 of the insulating layer is made of a polymer material layer or a molding compound material layer that is the same as that of the second portion 130 of the insulating layer (e.g., the buffer layer).

Figure 8:
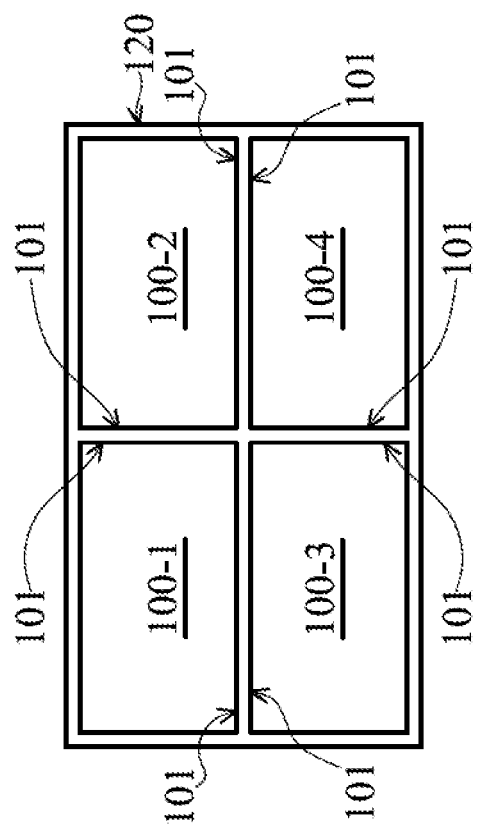
FIG. 8 is a plan view of an arrangement of semiconductor dies in a chip package structure, in accordance with some embodiments.
Figure 7:
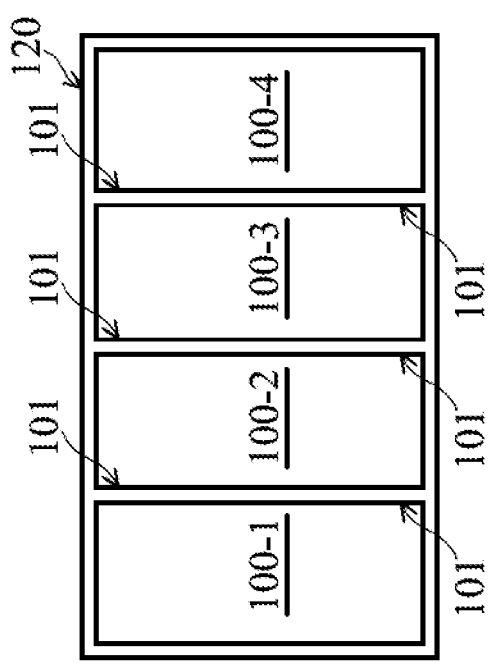
FIG. 7 is a plan view of an arrangement of semiconductor dies in a chip package structure, in accordance with some embodiments.
Figure 9:
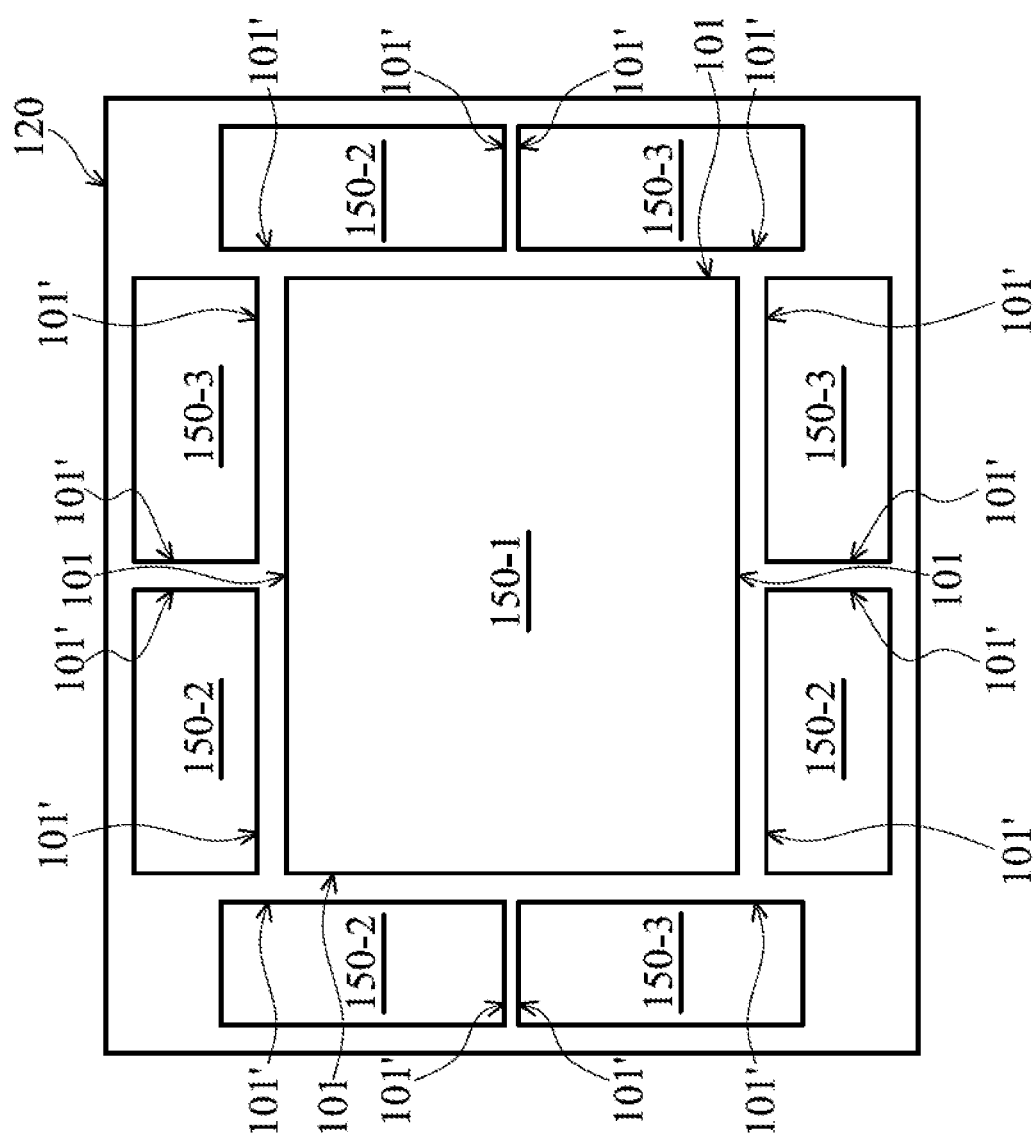
FIG. 9 is a plan view of an arrangement of semiconductor dies in a chip package structure, in accordance with some embodiments.

Many variations and/or modifications can be made to embodiments of the disclosure. For example, the chip package structure 10 shown in FIG. 1E includes two homogeneous semiconductor dies (e.g., the first semiconductor die 100-1 and the second semiconductor die 100-2) arranged side by side, but embodiments of the disclosure are not limited thereto. FIGS. 7 to 9 show plan views of various arrangement of more than two homogeneous semiconductor dies in a chip package structure, in accordance with some embodiments. For clarity and easy of description, the insulating layer including the first portion 140 and the second portion 130 (as shown in FIG. 1E) is not shown in FIGS. 7 to 9.

As shown in FIG. 7, the chip package structure includes four homogeneous semiconductor dies (e.g., a first semiconductor die 100-1, a second semiconductor die 100-2, a third semiconductor die 100-3, and a fourth semiconductor die 100-4) arranged in a row and adjacent to each other, in accordance with some embodiments. In those cases, at least one semiconductor die includes two opposite tapered sidewalls. Moreover, the tapered sidewall of the semiconductor die faces to the tapered sidewall of the adjacent semiconductor die. For example, the second semiconductor die 100-2 and the third semiconductor die 100-3 include two opposite tapered sidewalls 101, and the first semiconductor die 100-1 and the fourth semiconductor die 100-4 include one tapered sidewall 101. The contour of those tapered sidewalls 101 is shown in FIG. 1D. All the gaps between those tapered sidewalls 101 have a top width and a bottom width less than the top width. In some other embodiments, the contour of those sidewalls 101 is replaced by one of the contours shown in FIGS. 2 to 6.

Similar to the chip package structure shown in FIG. 7, the chip package structure shown in FIG. 8 also includes four homogeneous semiconductor dies (e.g., a first semiconductor die 100-1, a second semiconductor die 100-2, a third semiconductor die 100-3, and a fourth semiconductor die 100-4). Unlike the chip package structure shown in FIG. 7, the homogeneous semiconductor dies shown in FIG. 8 are arranged in an array and adjacent to each other, in accordance with some embodiments. In those cases, each of the semiconductor dies includes two adjacent tapered sidewalls. Moreover, the two adjacent tapered sidewalls of the semiconductor die respectively faces to two tapered sidewalls of different semiconductor dies. For example, a tapered sidewall 101 of the second semiconductor die 100-2 and a tapered sidewall 101 of the third semiconductor die 100-3 respectively face to the two adjacent tapered sidewalls 101 of the first semiconductor die 100-1 or the fourth semiconductor die 100-4. The contour of those tapered sidewalls 101 is shown in FIG. 1D. All the gaps between those tapered sidewalls 101 has a top width and a bottom width less than the top width. In some other embodiments, the contour of those sidewalls 101 is replaced by one of the contours shown in FIGS. 2 to 6.

As shown in FIG. 9, the chip package structure includes more than four homogeneous semiconductor dies (e.g., a first semiconductor die 150-1, second semiconductor dies 150-2, and third semiconductor dies 150-3) adjacent to each other, in accordance with some embodiments. In some embodiments, the first semiconductor die 150-1 is surrounded by the second semiconductor dies 150-2 and the third semiconductor dies 150-3. Moreover, each of the second semiconductor dies 150-2 is adjacent to one of the third semiconductor die 150-3. In those cases, the first semiconductor die 150-1, the second semiconductor dies 150-2, and the third semiconductor dies 150-3 may have different sizes. For example, the size of the second semiconductor dies 150-3 is smaller than the size of the first semiconductor die 150-1 and substantially equal to the size of the third semiconductor dies 150-2. Moreover, the first semiconductor die 150-1 includes four tapered sidewalls 101, and each of the second and third semiconductor dies 150-2 and 150-3 includes two adjacent tapered sidewalls 101'. Similar to FIG. 7 or 8, those tapered sidewalls 101 and 101' have a contour that is the same as or similar to the sidewall 101 shown in FIG. 1D, so that the gaps between the tapered sidewalls 101' and between the tapered sidewalls 101' and 101 have a top width and a bottom width less than the top width. In some other embodiments, the contour of those sidewalls 101 and 101' is replaced by one of the contours shown in FIGS. 2 to 6.

Figure 10:
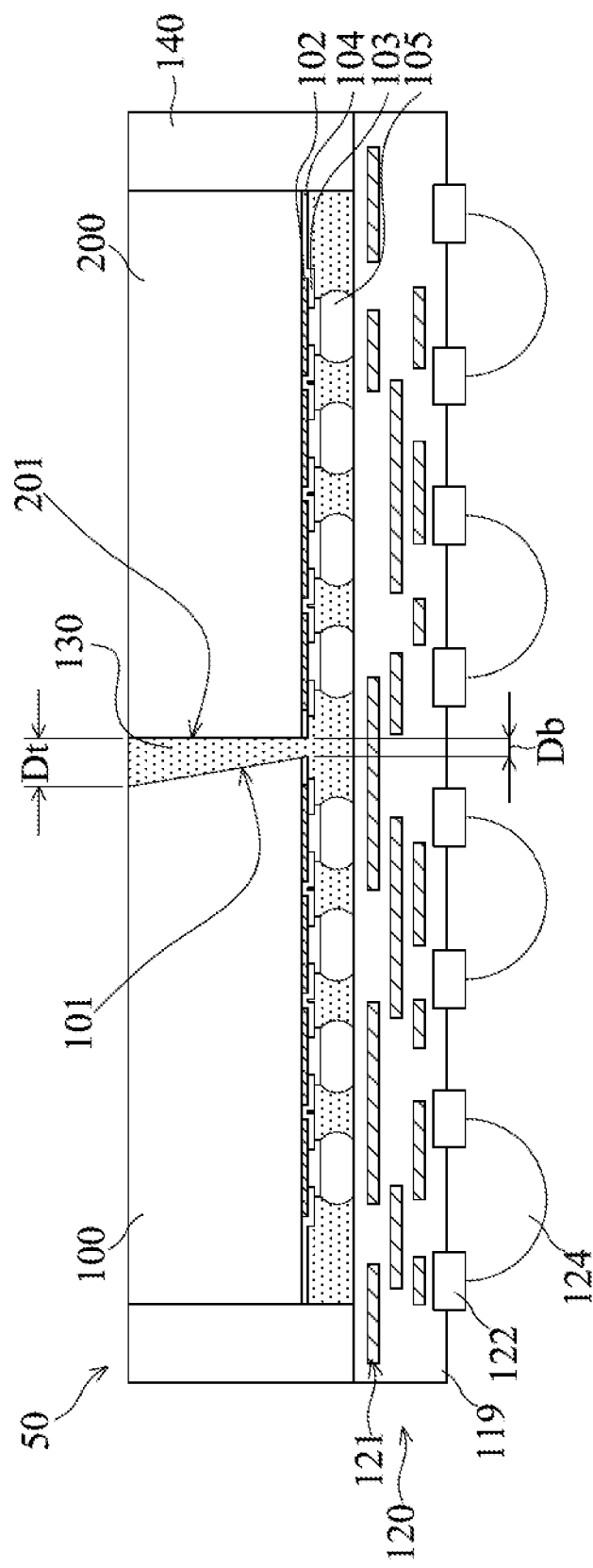
FIG. 10 is a cross-sectional view of a chip package structure, in accordance with some embodiments.

Many variations and/or modifications can be made to embodiments of the disclosure. For example, the chip package structure 10 shown in FIG. 1E includes two homogeneous dies, but embodiments of the disclosure are not limited thereto. FIG. 10 shows a cross-sectional view of a chip package structure 50, in accordance with some embodiments. The chip package structure 50 shown in FIG. 10 is similar to the chip package structure 10 shown in FIG. 1E. In some embodiments, the materials, formation methods, and/or benefits of the chip package structure 10 shown in FIGS. 1A to 1E may also be applied in the embodiments illustrated in FIG. 10, and are therefore not repeated.

Unlike the chip package structure 10 shown in FIG. 1E, the chip package structure 50 shown in FIG. 10 includes at least two heterogeneous semiconductor dies (e.g., a first semiconductor die 100 and a second semiconductor die 200). More specifically, the first semiconductor die 100 is a SoC die, and the second semiconductor die 200 is a memory die, such as a high bandwidth memory (HBM) die. Moreover, the first semiconductor die 100 has a sidewall 101 with a tapered contour, and the second semiconductor die 200 has a sidewall 201 with a vertical contour. As a result, the contour of the sidewall 101 and the contour of the sidewall 201 are asymmetric with respect to a central line of the second portion 130 of the insulating layer that is between the first semiconductor die 100 and the second semiconductor die 200.

In some other embodiments, the sidewall 201 of the second semiconductor die 200 also has a tapered contour. In those cases, the top die-to-die distance Dt defined by the sidewalls 101 and 201 is also greater than the bottom die-to-die distance Db defined by the sidewalls 101 and 201.

In some other embodiments, the contour of the sidewall 101 is replaced by one of the contours shown in FIGS. 2 to 6. In those cases, the top die-to-die distance Dt defined by the sidewalls 101 and 201 is also greater than the bottom die-to-die distance Db defined by the sidewalls 101 and 201. In some other embodiments, the insulating layer (i.e., the encapsulating layer or package layer) in the chip package structure 50 includes a homogeneous material. More specifically, the first portion 140 of the insulating layer is made of a polymer material layer or a molding compound material layer that is the same as that of the second portion 130 of the insulating layer (e.g., the buffer layer).

Figure 12:
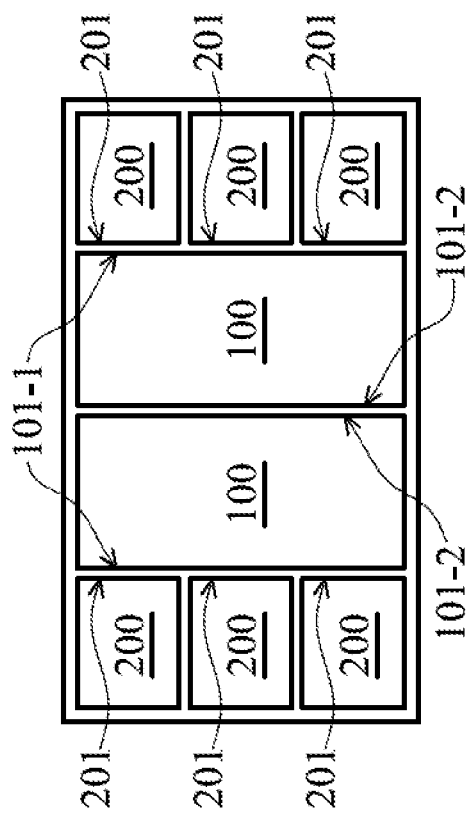
FIG. 12 is a plan view of an arrangement of semiconductor dies in a chip package structure, in accordance with some embodiments.
Figure 11:
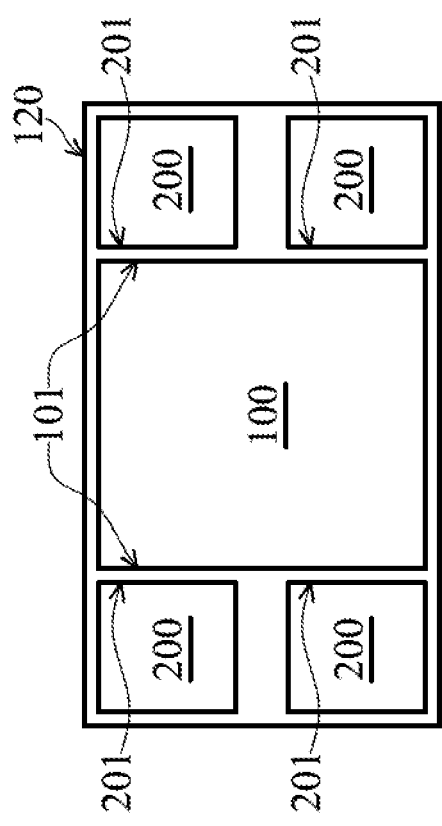
FIG. 11 is a plan view of an arrangement of semiconductor dies in a chip package structure, in accordance with some embodiments.
Figure 13:
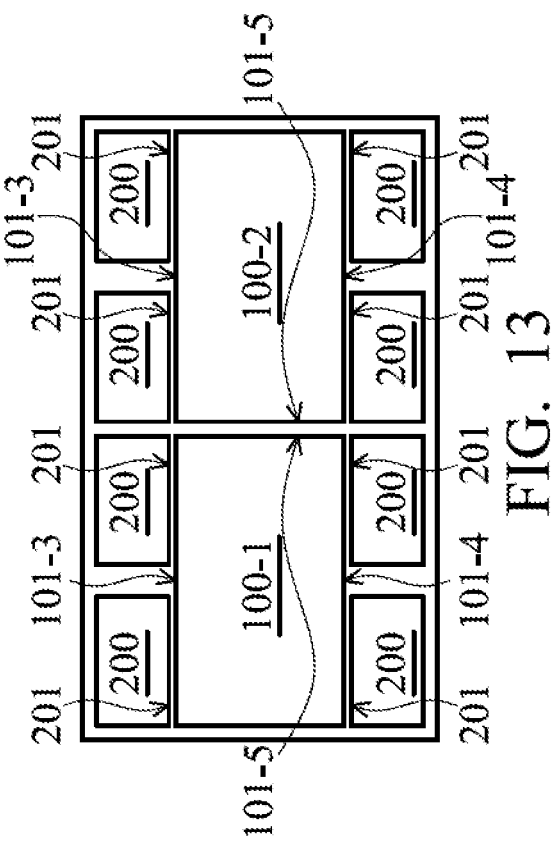
FIG. 13 is a plan view of an arrangement of semiconductor dies in a chip package structure, in accordance with some embodiments.

Many variations and/or modifications can be made to embodiments of the disclosure. For example, the chip package structure 50 shown in FIG. 10 includes two heterogeneous semiconductor dies (e.g., the first semiconductor die 100 and the second semiconductor die 200) arranged side by side, but embodiments of the disclosure are not limited thereto. FIGS. 11 to 13 show plan views of various arrangement of more than two heterogeneous semiconductor dies in a chip package structure, in accordance with some embodiments. For clarity and easy of description, the insulating layer including the first portion 140 and the second portion 130 (as shown in FIG. 10) is not shown in FIGS. 11 to 13.

As shown in FIG. 11, the chip package structure includes more than two heterogeneous semiconductor dies (e.g., a first semiconductor die 100 and second semiconductor dies 200 that have different size form the first semiconductor die 100) adjacent to each other, in accordance with some embodiments. More specifically, the second semiconductor dies 200 are correspondingly arranged adjacent to the corners of the first semiconductor die 100. In some embodiments, all the gaps between the larger first semiconductor die 100 and the smaller second semiconductor dies 200 have a top width/distance greater than the bottom width/distance. Such top and bottom width/distances are defined by two opposite sidewalls of the gap that face the first semiconductor die 100 and the second semiconductor die 200, respectively. In those cases, the first semiconductor die 100 includes two opposite tapered sidewalls 101. Moreover, each of the tapered sidewalls 101 faces to the sidewalls 201 of two adjacent second semiconductor dies 200 (which are arranged side by side). In some embodiments, one of the two opposite sidewalls of the gap is the tapered sidewall 101, and the other is the sidewall 201. In some embodiments, the two opposite sidewalls of the gap are two opposite sidewalls of the insulating layer (not shown) formed in the gap. The contour of those tapered sidewalls 101 and 201 is shown in FIG. 10. In some other embodiments, the contour of those opposite tapered sidewalls 101 is replaced by one of the contours shown in FIGS. 2 to 6.

In some embodiments, all the gaps between the two adjacent second semiconductor dies 200 also have a top width/distance greater than the bottom width/distance. Such top and bottom width/distances are defined by two opposite sidewalls of the gap that face to the two adjacent second semiconductor dies 200 (which are arranged side by side), respectively.

Similar to the chip package structure shown in FIG. 11, the chip package structure shown in FIG. 12 also includes more than two heterogeneous semiconductor dies (e.g., two first semiconductor dies 100 and six second semiconductor dies 200). More specifically, the first semiconductor dies 100 are arranged side by side and adjacent to each other. Each of the two first semiconductor dies 100 is also adjacent to three semiconductor dies 200 that are arranged side by side and adjacent to each other. In some embodiments, all of first gaps between the larger first semiconductor die 100 and the smaller second semiconductor dies 200 and the second gap between the larger first semiconductor dies 100 have a top width/distance greater than the bottom width/distance. Such top and bottom width/distances are defined by two opposite sidewalls of the first gap that face the first semiconductor die 100 and the second semiconductor die 200, respectively, or defined by two opposite sidewalls of the second gap that face the two adjacent first semiconductor dies 100. In those cases, each of the first semiconductor dies 100 includes two opposite tapered sidewalls (e.g., a first sidewall 101-1 and an opposite second sidewall 101-2). Moreover, the first sidewall 101-1 of each first semiconductor die 100 faces to the sidewalls 201 of three second semiconductor dies 200 (which are arranged in a row). The second sidewalls 101-2 of the first semiconductor dies 100 face to each other. In some embodiments, one of the two opposite sidewalls of the first gap is the first tapered sidewall 101-1, and the other is the sidewall 201. Moreover, the two opposite sidewalls of the second gap are the second tapered sidewalls 101-2 of the two adjacent first semiconductor dies 100, respectively. In some embodiments, the two opposite sidewalls of the first or second gap are two opposite sidewalls of the insulating layer (not shown) formed in the first or second gap. The contour of the first and second tapered sidewalls 101-1 and 101-2 is the same as the tapered sidewall 101 shown in FIG. 10 and the contour of the sidewall 201 is shown in FIG. 10. In some other embodiments, the contour of the opposite first and second tapered sidewalls 101-1 and 101-2 is replaced by one of the contours shown in FIGS. 2 to 6.

Similarly, all the gaps between the two adjacent second semiconductor dies 200 also have a top width/distance greater than the bottom width/distance. Such top and bottom width/distances are defined by two opposite sidewalls of the gap that face to the two adjacent second semiconductor dies 200 (which are arranged side by side), respectively.

Similar to the chip package structure shown in FIG. 12, the chip package structure shown in FIG. 13 also includes more than two heterogeneous semiconductor dies (e.g., two first semiconductor dies 100 and eight second semiconductor dies 200). More specifically, the first semiconductor dies 100 are arranged side by side and adjacent to each other. Each of the two first semiconductor dies 100 is also adjacent to four semiconductor dies 200 that are arranged at the corners thereof. Similar to the embodiments shown in FIG. 12, all of first gaps between the larger first semiconductor die 100 and the smaller second semiconductor dies 200 and the second gap between the larger first semiconductor dies 100 have a top width/distance greater than the bottom width/distance. In those cases, each of the first semiconductor dies 100 includes three tapered sidewalls (e.g., a first tapered sidewall 101-3, a second tapered sidewall 101-4 opposite to the first sidewall 101-3, and a third tapered sidewall 101-5 adjoining the first and second tapered sidewalls 101-3 and 101-4). Moreover, the first tapered sidewall 101-3 of each first semiconductor die 100 faces to the sidewalls 201 of two second semiconductor dies 200 (which are arranged side by side). The second tapered sidewall 101-4 of each first semiconductor die 100 faces to the sidewalls 201 of two second semiconductor dies 200 (which are arranged side by side). The third tapered sidewalls 101-5 of the two adjacent first semiconductor dies 100 face to each other. In some embodiments, one of the two opposite sidewalls of the first gap is the first tapered sidewall 101-3 or the second tapered sidewall 101-4, and the other is the sidewall 201. Moreover, the two opposite sidewalls of the second gap are the third tapered sidewalls 101-5 of the two adjacent first semiconductor dies 100, respectively. In some embodiments, the two opposite sidewalls of the first or second gap are two opposite sidewalls of the insulating layer (not shown) formed in the first or second gap. The contour of the first, second and third tapered sidewalls 101-3, 101-4 and 101-5 is the same as the tapered sidewall 101 shown in FIG. 10 and the contour of the sidewall 201 is shown in FIG. 10. In some other embodiments, the contour of the tapered sidewalls 101 is replaced by one of the contours shown in FIGS. 2 to 6.

Similarly, all the gaps between the two adjacent second semiconductor dies 200 also have a top width/distance greater than the bottom width/distance. Such top and bottom width/distances are defined by two opposite sidewalls of the gap that face to the two adjacent second semiconductor dies 200 (which are arranged side by side), respectively.

Embodiments of the disclosure provide structures and formation methods of chip package structures. The chip package structure includes a first semiconductor die and an adjacent second semiconductor die bonded over an interposer substrate. An insulating layer is formed to cover the interposer substrate, the first semiconductor die, and the second semiconductor die. After the formation of the insulating layer, a portion of the insulating layer is between the first sidewall of the first semiconductor die and the second sidewall of the second semiconductor die. Moreover, the top lateral distance from the top of the first sidewall to the top of the second sidewall is greater than the bottom lateral distance from the bottom of the first sidewall to the bottom of the second sidewall. Since top lateral distance between the first sidewall and the second sidewall is enlarged, as compared to the bottom lateral distance between the first sidewall and the second sidewall, the shrinkage effect at room temperature and the expansion effect at high temperature can be provided by the insulating layer formed between semiconductor dies. As a result, package warpage due to the CTE mismatch between the semiconductor dies and the interposer substrate is reduced. Moreover, since smaller bottom lateral distance between the first sidewall and the second sidewall is maintained, as compared to the top lateral distance between the first sidewall and the second sidewall, the tensile-stress in the RDL structure induced from the interposer substrate is mitigated. As a result, the fin-line trace crack issue is reduced, thereby improving the reliability of the RDL structure.

In accordance with some embodiments, a chip package structure is provided. The chip package structure includes a first semiconductor die and an adjacent second semiconductor die bonded over an interposer substrate. The chip package structure also includes an insulating layer formed over the interposer substrate. The insulating layer has a first portion surrounding the first and second semiconductor dies and a second portion extending between a first sidewall of the first semiconductor die and a second sidewall of the second semiconductor die, and between the interposer substrate and the first and second semiconductor dies. A lateral distance from a top end of the first sidewall to a top end of the second sidewall is greater than a lateral distance from a bottom end of the first sidewall to a bottom end of the second sidewall.

In accordance with some embodiments, a chip package structure is provided. The chip package structure includes an organic substrate having a redistribution structure. The chip package structure also includes a first semiconductor die and a second semiconductor die arranged side by side and over the organic substrate and electrically connected to the redistribution structure. The chip package structure further includes an underfill material layer formed between the first semiconductor die and the second semiconductor die and having a first sidewall facing the first semiconductor die and a second sidewall opposite the first sidewall and facing the second semiconductor die. A top width of the underfill material layer define by the first and second sidewalls is greater than a bottom width of the underfill material layer define by the first and second sidewalls. An upper portion of the first sidewall has a tapered, concave or convex contour.

In accordance with some embodiments, a method for forming a chip package structure is provided. The method includes bonding a plurality of connectors over a front surface of a semiconductor wafer and dicing the semiconductor wafer from a rear surface of the semiconductor wafer to form a plurality of semiconductor dies. The method also includes mounting first and second semiconductor dies in the plurality of semiconductor dies over an interposer substrate. A first sidewall of the first semiconductor die faces a second sidewall of the second semiconductor die, and at least upper portions of the first sidewall and the second sidewall have a tapered, concave or convex contour, to define a top die-to-die distance and a bottom die-to-die distance that is less than the top die-to-die distance. The method further includes forming an encapsulating layer over the interposer substrate to cover the first semiconductor die and the second semiconductor die.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A chip package structure, comprising:
   an interposer substrate comprising an organic base layer;
   a polymer passivation layer covering a bottom surface of the organic base layer, wherein an outer edge of the organic base layer laterally protrude from an outer edge of the polymer passivation layer;
   a first semiconductor die and an adjacent second semiconductor die bonded over the interposer substrate; and
   an insulating layer formed over the interposer substrate, having a first portion surrounding the first and second semiconductor dies and a second portion extending between a first sidewall of the first semiconductor die and a second sidewall of the second semiconductor die, and between the interposer substrate and the first and second semiconductor dies,
   wherein a lateral distance from a top end of the first sidewall to a top end of the second sidewall is greater than a lateral distance from a bottom end of the first sidewall to a bottom end of the second sidewall, and
   wherein an interface between the first portion and the second portion of the insulating layer extends along a direction that is vertical to an upper surface of the interposer substrate.

2. The chip package structure as claimed in claim 1, wherein at least one of the first sidewall or the second sidewall has a tapered, concave or convex contour.

3. The chip package structure as claimed in claim 1, wherein one of the first sidewall and the second sidewall has a tapered, concave or convex contour, and the other has a vertical contour.

4. The chip package structure as claimed in claim 1, wherein at least one of the first sidewall or the second sidewall has an upper portion with a tapered, concave or convex contour and a lower portion with a vertical contour.

5. The chip package structure as claimed in claim 1, wherein the first semiconductor die and the second semiconductor die are homogeneous dies.

6. The chip package structure as claimed in claim 1, wherein the first semiconductor die and the second semiconductor die are heterogeneous dies.

7. The chip package structure as claimed in claim 1, wherein the first portion of the insulating layer is made of a molding compound material and the second portion of the insulating layer is made of an underfill material.

8. The chip package structure as claimed in claim 1, wherein the first portion of the insulating layer and the second portion of the insulating layer are made of a molding compound material.

9. The chip package structure as claimed in claim 1, wherein the interposer substrate further comprises a redistribution structure in the organic base layer, and a bottommost surface of the redistribution structure is no lower than a top surface of the polymer passivation layer.

10. A chip package structure, comprising:
an organic substrate having a redistribution structure;
a first semiconductor die and a second semiconductor die arranged side by side and over the organic substrate and electrically connected to the redistribution structure;
an underfill material layer formed between the first semiconductor die and the second semiconductor die and having a first sidewall facing the first semiconductor die and a second sidewall opposite the first sidewall and facing the second semiconductor die, wherein a top width of the underfill material layer defined by the first and second sidewalls is greater than a bottom width of the underfill material layer defined by the first and second sidewalls;
a molding compound material layer surrounding the first semiconductor die, the second semiconductor die, and the underfill material layer;
a first polymer passivation pattern disposed over a bottom surface of the organic substrate; and
a first electrical connector partially covering the first polymer passivation pattern, wherein an extending portion of the first polymer passivation pattern is vertically sandwiched between the organic substrate and the electrical connector, and the extending portion has a top surface in contact with the organic substrate and a bottom surface in contact with the electrical connector,
wherein the first sidewall extends along a first direction from a bottom of the first semiconductor die to a top of the first semiconductor die and the second sidewall extends along a second direction from a bottom of the second semiconductor die to a top of the second semiconductor die, and
wherein bottom surfaces of the underfill material layer and the molding compound material layer are in direct contact with a top surface of the organic substrate.

11. The chip package structure as claimed in claim 10, wherein contours of the first sidewall and the second sidewall are symmetric with respect to a central line of the underfill material layer.

12. The chip package structure as claimed in claim 10, wherein the second sidewall has a vertical contour.

13. The chip package structure as claimed in claim 10, further comprising:
a plurality of second electrical connectors formed between the first semiconductor die and a top surface of the organic substrate; and
a plurality of third electrical connectors formed between the second semiconductor die and the top surface of the organic substrate.

14. The chip package structure as claimed in claim 10, wherein the redistribution structure comprises integrated inductors or capacitors.

15. The chip package structure as claimed in claim 10, wherein each of the first semiconductor die and a second semiconductor die comprises:

a passivation layer covering the bottom of a corresponding semiconductor die in the first and second semiconductor dies;
a plurality of conductive pads embedded in the passivation layer;
a plurality of conductive pillars correspondingly formed on the plurality of conductive pads; and
a plurality of electrical connectors correspondingly bonded on the plurality of conductive pillars,
wherein a sidewall of the passivation layer has a slope that is same as that of an outer sidewall of the corresponding semiconductor die.

16. The chip package structure as claimed in claim 10, further comprising:
a second electrical connector disposed over the bottom surface of the organic substrate; and
a second polymer passivation pattern having a second extending portion directly under the second electrical connector and an exposing portion laterally extending toward the first electrical connector,
wherein the second polymer passivation pattern and the first polymer passivation pattern are laterally spaced apart from each other.

17. A chip package structure, comprising:
an organic interposer substrate having a redistribution structure;
a polymer passivation layer in direct contact with a bottom surface of the organic interposer substrate;
a plurality of electrical connectors formed in and partially covering the polymer passivation layer, wherein the polymer passivation layer has a plurality of openings, each of plurality of openings formed between two adjacent electrical connectors of the plurality of electrical connectors and exposing the bottom surface of the organic interposer substrate; and
a first semiconductor die and a second semiconductor die formed over and electrically connected to the redistribution structure of the organic interposer substrate, wherein the first semiconductor die has a first tapered sidewall and a first vertical sidewall opposite to the first tapered sidewall and the second semiconductor die has a second tapered sidewall facing to the first tapered sidewall and a second vertical sidewall opposite to the second tapered sidewall,
wherein the first tapered sidewall extends from a bottom of the first semiconductor die to a top of the first semiconductor die and the second tapered sidewall extends from a bottom of the second semiconductor die to a top of the second semiconductor die.

18. The chip package structure as claimed in claim 17, further comprising:
an insulating layer formed over the organic interposer substrate, having a first portion surrounding the first and second semiconductor dies and a second portion between and covering the first tapered sidewall and the second tapered sidewall.

19. The chip package structure as claimed in claim 18, wherein the first portion of the insulating layer is made of a molding compound material and the second portion of the insulating layer is made of an underfill material.

20. The chip package structure as claimed in claim 17, wherein a distance between two opposite out edges of the polymer passivation layer is shorter than a distance between two opposite out edges of the organic interposer substrate.

* * * * *